US 6,744,070 B2
Jun. 1, 2004

(54) THIN FILM TRANSISTOR AND LIQUID CRYSTAL DISPLAY DEVICE (75) Inventors: Yoshinori Shimada, Taki-gun (JP); Masao Kawaguchi, Taki-gun (JP); Hiroshi Ishibashi, Matsusaka (JP); Yukinobu Nakata, Taki-gun (JP); Keiichi Akamatsu, Taki-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/198,275

(22) Filed: Jul. 17, 2002

(65) Prior Publication Data

US 2002/0190334 A1 Dec. 19, 2002

Related U.S. Application Data (62) Division of application No. 09/369,913, filed on Aug. 6, 1999, now Pat. No. 6,448,578.

(30) Foreign Application Priority Data

Sep. 3, 1998 (JP) .......................... 10-249277

(51) Int. Cl.$^7$ .................. H01L 29/76; H01L 31/20; H01L 23/48
(52) U.S. Cl. .............. 257/72; 257/66; 257/59; 257/763
(58) Field of Search ............. 257/72, 66, 59, 257/763

(56) References Cited

U.S. PATENT DOCUMENTS

| 5,243,202 A | * | 9/1993 | Mori et al. | 257/59 |
|---|---|---|---|---|
| 5,334,544 A | | 8/1994 | Matsuoka et al. | 437/40 |
| 5,367,179 A | | 11/1994 | Mori et al. | 257/59 |

(List continued on next page.)

FOREIGN PATENT DOCUMENTS

| JP | 03-136280 | 6/1991 |
|---|---|---|
| JP | 05-136412 | 6/1993 |
| JP | 06-275559 | 9/1994 |
| JP | 08-248442 | 9/1996 |
| JP | 09-265114 | 10/1997 |
| JP | 10-197891 | 7/1998 |
| JP | 410253976 A | 9/1998 |

OTHER PUBLICATIONS

Japanese Office Action and English Translation.
Korean Office Action.
Translation of Korean Office Action.
Japanese KOKAI (Published unexamined patent application) No. 148683 (Tokukaihei 6–148683, Published Date: May 27, 1994).
Japanese KOKAI (Published unexamined patent application) No. 128676/1995 (Tokukaihei 7–128676, Published Date: May 19, 1995).

(List continued on next page.)

*Primary Examiner*—George Eckert
*Assistant Examiner*—Joseph Nguyen
(74) *Attorney, Agent, or Firm*—Edwards & Angell, LLP; David G. Conlin; Lisa Swiszcz Hazzard (57) ABSTRACT

In a thin-film transistor to be used in an active matrix liquid crystal display device, each of a gate signal line, a source signal line, and a drain extraction electrode has a three-layer structure. Specifically, each of these members is made up of a lower layer made of a titanium film, an intermediate layer made of an aluminum film, and an upper layer made of a titanium film containing nitrogen. Since the respective upper layers, in contact with a gate insulating film or an interlayer insulating film made of a silicon nitride film, are made of titanium films containing nitrogen, they have superior adhesion to the silicon nitride film. Consequently, film peeling, etc. during the manufacturing process can be suppressed. Further, providing the titanium film beneath the aluminum film contributes to reduction of the resistance of the aluminum film.

8 Claims, 4 Drawing Sheets

U.S. PATENT DOCUMENTS

| | | | |
|---|---|---|---|
| 5,371,398 A | 12/1994 | Nishihara | 257/435 |
| 5,640,067 A | 6/1997 | Yamauchi et al. | 313/504 |
| 5,804,878 A | 9/1998 | Miyazaki et al. | 257/764 |
| 6,087,678 A | 7/2000 | Kim | 257/59 |
| 6,104,042 A | 8/2000 | Sah | 257/59 |
| 6,107,640 A | 8/2000 | Park et al. | 257/59 |
| 6,107,668 A | 8/2000 | Ukita | 257/412 |
| 6,144,082 A | 11/2000 | Yamazaki et al. | 257/412 |
| 6,160,272 A | 12/2000 | Arai et al. | 257/72 |
| 6,201,281 B1 | 3/2001 | Miyazaki et al. | 257/347 |
| 6,207,971 B1 | 3/2001 | Jinno et al. | 257/72 |

OTHER PUBLICATIONS

Japanese KOKAI (Published unexamined patent application) No. 158072/1993 (Tokukaihei 5–158072, Published Date: Jun. 25, 1993).

Japanese KOKAI (Published unexamined patent application) No. 104437/1994 Tokukaihei 6–10442=37, Published Date Apr. 15, 1994.

Japanese KOKAI (Published unexamined patent application) No. 153623/1997 Tokukaihei 9–153623, Published Date: Jun. 10, 1997.

* cited by examiner

THIN FILM TRANSISTOR AND LIQUID CRYSTAL DISPLAY DEVICE

CROSS REFERENCE TO RELATED APPLICATIONS

This application is a divisional application of U.S. patent application Ser. No. 09/369,913, filed Aug. 6, 1999 U.S. Pat. No. 6,488,578.

FIELD OF THE INVENTION

The present invention relates to a thin-film transistor for use as a switching element in, for example, an active matrix liquid crystal display device, and to a liquid crystal display device provided with such a thin-film transistor.

BACKGROUND OF THE INVENTION

Conventionally, liquid crystal display devices using nematic liquid crystal have been widely used for segment-type liquid crystal display devices in watches, calculators, etc. Recently, the market for such liquid crystal display devices is further expanding as they are applied in word processors, personal computers, car navigation systems, etc. as display means which make the most of features such as thinness, light weight, and low power consumption. Particular attention is being directed to use of nematic liquid crystal in liquid crystal display devices of the active matrix type, in which active elements such as thin-film transistors (TFTs) are used as switching elements for pixels in a matrix arrangement.

In comparison with, for example, CRTs (cathode ray tubes), liquid crystal display devices of this type have advantages such as greatly reduced thickness (depth), ease of performing full color display, and low power consumption, and thus demand for this type of liquid crystal display device is growing in even more fields, such as display devices for laptop and desktop computers, portable and space-saving televisions, display devices for digital cameras and digital video cameras, etc.

An active matrix liquid crystal display device includes an active matrix substrate provided with active matrix circuits using TFTs, a counter substrate opposite the active matrix substrate, provided with a common electrode, and a liquid crystal layer held between the active matrix substrate and the counter substrate. Display operations are performed by controlling voltages applied to the liquid crystal layer.

On the active matrix substrate, a plurality of pixel electrodes are provided in the form of a matrix. Further, on the counter substrate is provided a common electrode opposite the pixel electrodes on the other side of the liquid crystal layer. Voltages are applied to the liquid crystal by the pixel electrodes and the common electrode. Incidentally, the common electrode is generally structured so as to be provided over substantially the entire surface of the counter substrate.

Further, the active matrix substrate is provided with TFTs as active elements, which are switching means for selective driving of the pixel electrodes, each TFT being connected to a pixel electrode. Further, to enable color display, a color filter layer of, for example, red, blue, and green is provided, for example, on the counter substrate or on the active matrix substrate.

In each TFT, a gate electrode is connected to a scanning line, and a source electrode is connected to a grayscale signal line. The ON/OFF state of a given TFT is controlled by inputting a gate signal through the corresponding scanning line, and when the TFT is ON, a data signal is inputted to the pixel electrode through the grayscale signal line.

Each TFT on the active matrix substrate is structured as follows. On a transparent insulating substrate, a gate electrode and a gate signal line (as a scanning line) are provided, and a gate insulating film is provided so as to cover the gate electrode and the remainder of the transparent insulating substrate. On the upper surface of the gate insulating film above the gate electrode is provided a semiconductor layer, the upper surface of which is in turn provided with two $n^+$-Si layers forming the source and drain electrodes. On the upper surfaces of the two $n^+$-Si layers are provided a source signal line (as a grayscale signal line) and a drain extraction electrode, the upper surfaces of which are in turn provided with an interlayer insulating film. The upper surface of the interlayer insulating film is provided with the pixel electrode.

In order to realize large size or high resolution in the liquid crystal display device, it is necessary to provide the gate signal lines and source signal lines of a low-resistance material. Consequently, low-resistance, easily worked metals such as aluminum are widely used as materials for the gate signal lines and source signal lines.

However, with lines made of aluminum, manufacturing steps involving heat processing, performed after formation of the lines, cause hillocks to form in the lines. These hillocks may break through the insulating film, etc. provided above the lines, causing leakage.

As a structure for preventing the formation of these hillocks, Japanese Unexamined Patent Publication Nos. 6-148683/1994 (Tokukaihei 6-148683, published May 27, 1994), 7-128676/1995 (Tokukaihei 7-128676, published May 19, 1995), and 5-158072/1993 (Tokukaihei 5-158072, published Jun. 25, 1993), for example, disclose structures including aluminum lines provided with an upper layer of a metal having a higher melting point than aluminum. Again, Japanese Unexamined Patent Publication No. 6-104437/1994 (Tokukaihei 6-104437, published Apr. 15, 1994) discloses a structure which prevents hillocks by using lines made of aluminum with an anodized surface.

Further, Japanese Unexamined Patent Publication 9-153623/1997 (Tokukaihei 9-153623, published Jun. 10, 1997) discloses a structure which prevents both hillocks and voids by using lines made of an intermediate layer of aluminum between upper and lower layers made of high-melting-point metal films. It is possible in this way to prevent the formation of hillocks by means of a laminar structure of aluminum and a high-melting-point metal, but it is necessary to simplify the manufacturing process in order to minimize increases in the cost of the liquid crystal display device. Accordingly, it is preferable to use high-melting-point materials, such as titanium and molybdenum, which can be patterned at the same time as the aluminum.

Since titanium, in particular, is a material resistant to electric corrosion, a structure for a liquid crystal display device has been proposed whereby gate signal lines are provided in a three-layer structure of an upper layer of titanium, an intermediate layer of aluminum, and a lower layer of titanium. Here, a liquid crystal display device is prepared by providing, on gate signal lines with the foregoing structure, a gate insulating film of silicon nitride formed by plasma CVD (chemical vapor deposition), and then providing a semiconductor layer, source electrodes, and source signal lines.

However, with a structure like the foregoing, there is poor adhesion between the titanium film forming the upper layer of the gate signal line and the gate insulating layer made of a silicon nitride film, and the silicon nitride film may peel off during subsequent manufacturing steps, reducing yield. Furthermore, when the source signal lines are also provided with an equivalent three-layer structure, the same problem occurs between the source signal lines and the interlayer insulating film formed thereon, which is made of a silicon nitride film.

SUMMARY OF THE INVENTION

It is an object of the present invention to provide an inexpensive thin-film transistor with stable properties by realizing good adhesion between, for example, a gate signal line and a gate insulating film of silicon nitride provided thereon, and to provide a liquid crystal display device including such a thin-film transistor.

In order to attain the foregoing object, a thin-film transistor according to the present invention may be structured so as to comprise a gate signal line; a gate insulating film made of a silicon nitride film, provided on the gate signal line; a semiconductor layer provided on the gate insulating film; and a source signal line and/or a drain extraction electrode; in which the gate signal line includes a first layer made of a titanium film containing nitrogen, provided in contact with the gate insulating film, and a second layer made of a film containing aluminum, provided beneath the first layer.

In the foregoing structure, the gate signal line includes a first layer made of a titanium film containing nitrogen, provided in contact with the gate insulating film, and a second layer made of a film containing aluminum, provided beneath the first layer. Accordingly, adhesion with the gate insulating film of silicon nitride is improved in comparison with a case in which the layer in contact with the silicon nitride film is made of a titanium film. Consequently, film peeling during the manufacturing process can be suppressed, and a thin-film transistor with more stable properties can be provided with good yield.

Further, a thin-film transistor according to the present invention may be structured so as to comprise a gate signal line; a gate insulating film provided on the gate signal line; a semiconductor layer provided on the gate insulating film; a source signal line and/or a drain extraction electrode; and an interlayer insulating film made of a silicon nitride film, provided on the source signal line and/or drain extraction electrode; in which the source signal line and/or drain extraction line includes a first layer made of a titanium film containing nitrogen, provided in contact with the interlayer insulating film, and a second layer made of a film containing aluminum, provided beneath the first layer.

In the foregoing structure, the source signal line and/or drain extraction line includes a first layer made of a titanium film containing nitrogen, provided in contact with the interlayer insulating film, and a second layer made of a film containing aluminum, provided beneath the first layer. Accordingly, adhesion with the interlayer insulating film of silicon nitride is improved in comparison with a case in which the layer in contact with the silicon nitride film is made of a titanium film. Consequently, film peeling during the manufacturing process can be suppressed, and a thin-film transistor with more stable properties can be provided with good yield.

A liquid crystal display device according to the present invention may be structured so as to comprise an active matrix substrate provided with a plurality of thin-film transistors, a counter substrate provided opposite the active matrix substrate with an interval therebetween, and a liquid crystal layer in the interval between the active matrix substrate and the counter substrate; in which each thin-film transistor comprises a gate signal line; a gate insulating film made of a silicon nitride film, provided on the gate signal line; a semiconductor layer provided on the gate insulating film; and a source signal line and/or a drain extraction electrode; the gate signal line including a first layer made of a titanium film containing nitrogen, provided in contact with the gate insulating film, and a second layer made of a film containing aluminum, provided beneath the first layer.

In the foregoing structure, the gate signal line includes a first layer made of a titanium film containing nitrogen, provided in contact with the gate insulating film, and a second layer made of a film containing aluminum, provided beneath the first layer. Accordingly, adhesion with the gate insulating film of silicon nitride is improved in comparison with a case in which the layer in contact with the silicon nitride film is made of a titanium film. Consequently, film peeling during the manufacturing process can be suppressed, and a thin-film transistor with more stable properties can be provided with good yield.

Further, a liquid crystal display device according to the present invention may be structured so as to comprise an active matrix substrate provided with a plurality of thin-film transistors, a counter substrate provided opposite the active matrix substrate with an interval therebetween, and a liquid crystal layer in the interval between the active matrix substrate and the counter substrate; in which each thin-film transistor comprises a gate signal line; a gate insulating film provided on the gate signal line; a semiconductor layer provided on the gate insulating film; a source signal line and/or a drain extraction electrode; and an interlayer insulating film made of a silicon nitride film, provided on the source signal line and/or drain extraction electrode; the source signal line and/or drain extraction line including a first layer made of a titanium film containing nitrogen, provided in contact with the interlayer insulating film, and a second layer made of a film containing aluminum, provided beneath the first layer.

In the foregoing structure, the source signal line and/or drain extraction line includes a first layer made of a titanium film containing nitrogen, provided in contact with the interlayer insulating film, and a second layer made of a film containing aluminum, provided beneath the first layer. Accordingly, adhesion with the interlayer insulating film of silicon nitride is improved in comparison with a case in which the layer in contact with the silicon nitride film is made of a titanium film. Consequently, film peeling during the manufacturing process can be suppressed, and a thin-film transistor with more stable properties can be provided with good yield.

Additional objects, features, and strengths of the present invention will be made clear by the description below. Further, the advantages of the present invention will be evident from the following explanation in reference to the drawings.

DESCRIPTION OF THE EMBODIMENTS

The following will explain one embodiment of the present invention with reference to FIGS. 1 through 4.

A liquid crystal display device according to the present invention includes an active matrix substrate provided with active matrix circuits using TFTs, a counter substrate opposite the active matrix substrate, provided with a common electrode, and a liquid crystal layer held between the active matrix substrate and the counter substrate. Display operations are performed by controlling voltages applied to the liquid crystal layer.

Figure 2:
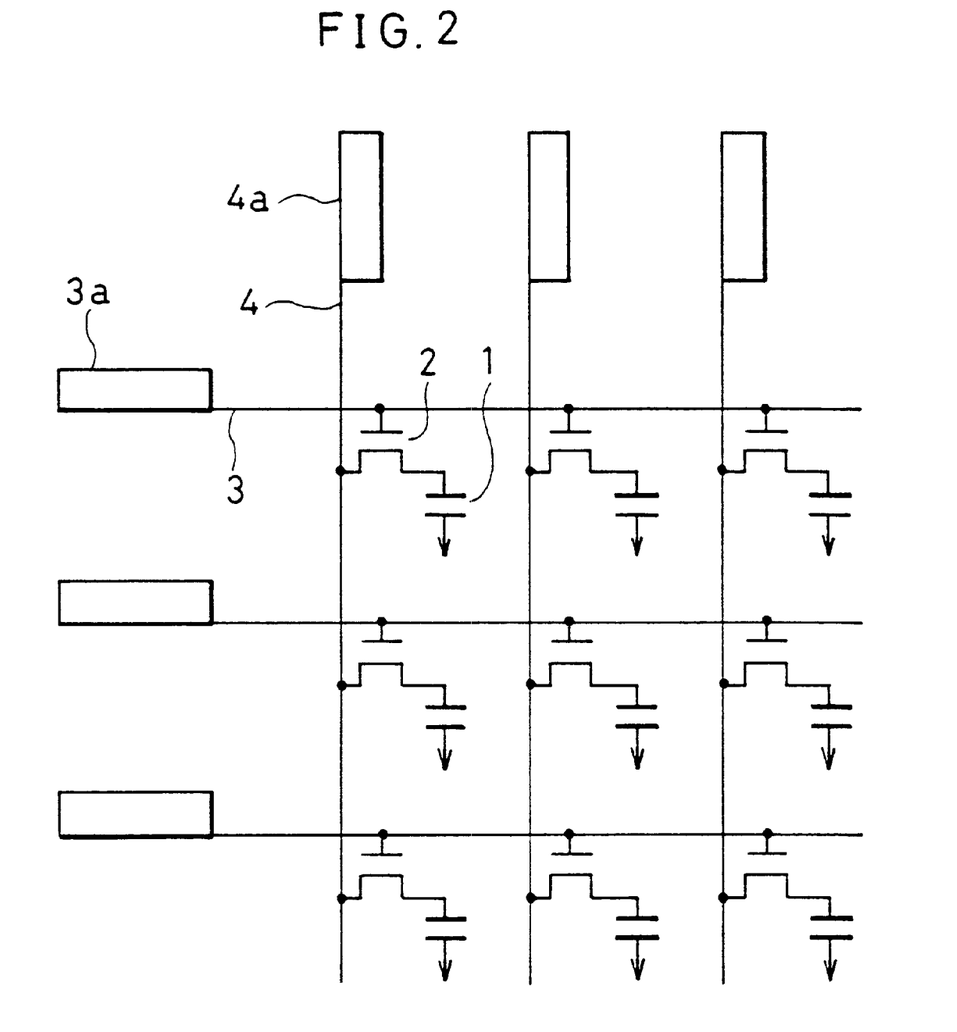
FIG. 2 is a circuit diagram schematically showing the structure of the foregoing active matrix substrate.

FIG. 2 is a circuit diagram showing one example of a structure for the active matrix circuit on the active matrix substrate. On the active matrix substrate are provided a plurality of pixel electrodes 1 in the form of a matrix. Typically, several hundred or more of these pixel electrodes are provided in each of a row direction and a column direction.

Further, on the counter substrate (not shown) is provided a common electrode (not shown) opposite the pixel electrodes on the other side of the liquid crystal layer. Voltages are applied to the liquid crystal by the pixel electrodes and the common electrode. Incidentally, the common electrode is generally structured so as to be provided over substantially the entire surface of the counter substrate.

Further, the active matrix substrate is provided with TFTs 2 as active elements, which are switching means for selective driving of the pixel electrodes 1, each TFT 2 being connected to a pixel electrode 1. Further, to enable color display, a color filter layer (not shown) of, for example, red, blue, and green is provided, for example, on the counter substrate or on the active matrix substrate.

In each TFT 2, a gate electrode is connected to a scanning line 3, and a source electrode is connected to a grayscale signal line 4. The scanning lines 3 and the grayscale signal lines 4 run along the peripheries of the TFTs 2 provided in the form of a matrix, and run in directions which intersect at right angles. The ON/OFF state of a given TFT 2 is controlled by inputting a gate signal through the corresponding scanning line 3, and when the TFT 2 is ON, a data signal is inputted to the pixel electrode 1 through the grayscale signal line 4. Incidentally, the end of each scanning line 3 is connected to a scanning signal input terminal 3a, and the end of each grayscale signal line 4 is connected to a data signal input terminal 4a.

Figure 3:
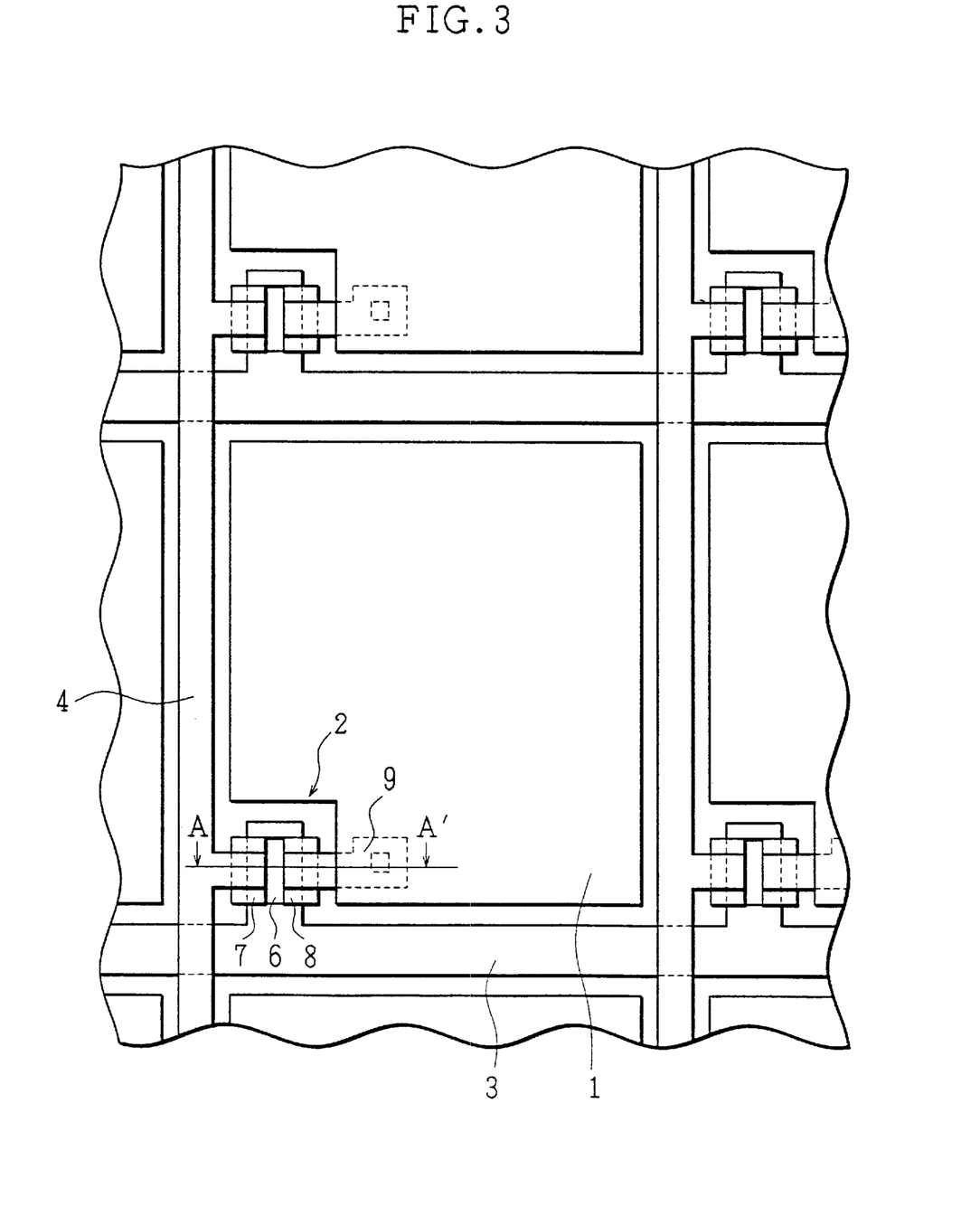
FIG. 3 is a plan view showing part of the foregoing active matrix substrate, viewed from above.

FIG. 3 is an enlarged plan view showing part of the surface of the active matrix substrate. As shown in FIG. 3, a pixel electrode 1 and a TFT 2 are provided in an area bounded by scanning lines 3 running parallel to each other and grayscale signal lines 4 running parallel to each other and in a direction which intersects with the scanning lines 3 at right angles.

Figure 1:
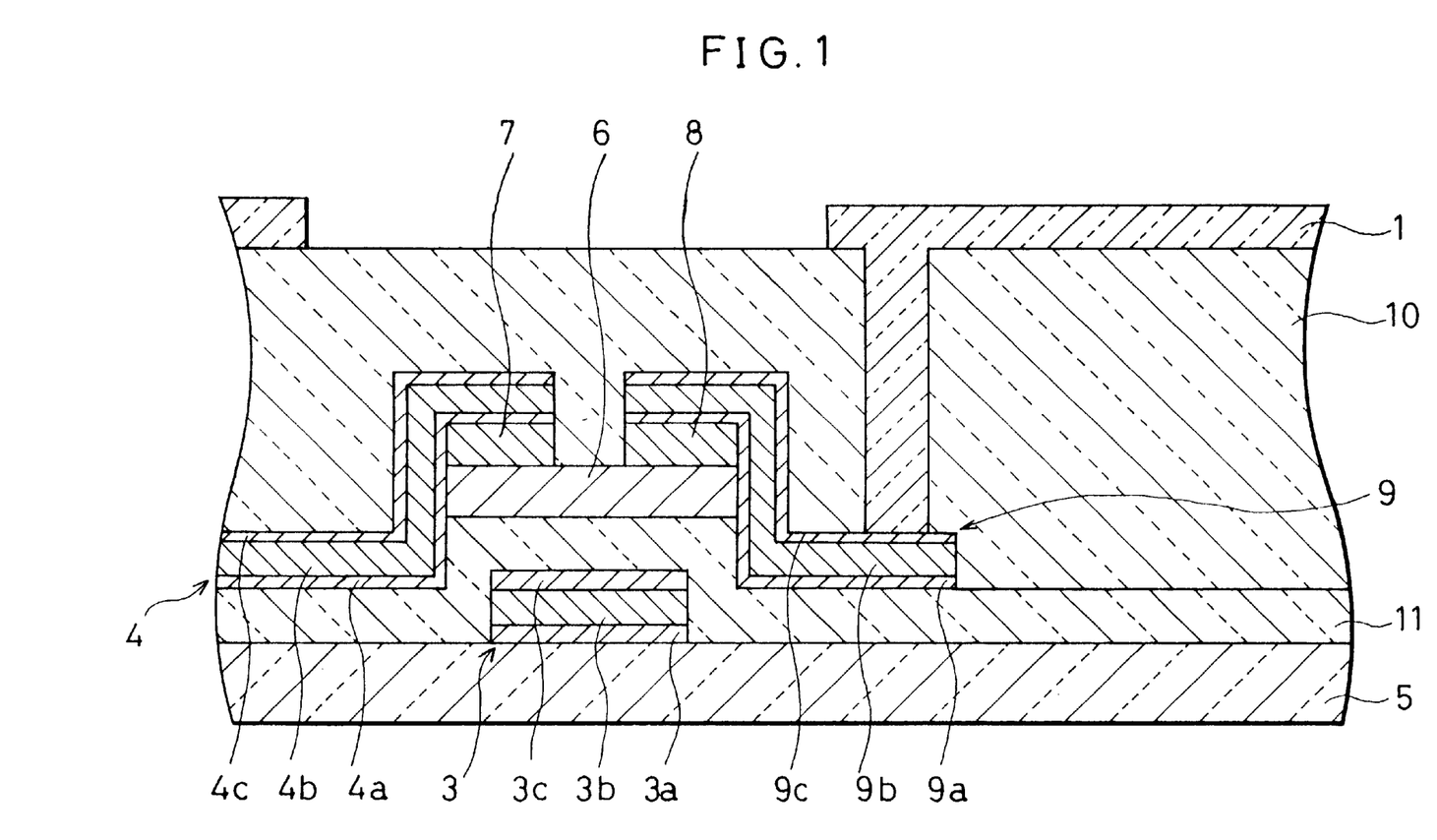
FIG. 1 is a cross-sectional view schematically showing the structure of an active matrix substrate provided in a liquid crystal display device according to one embodiment of the present invention.

FIG. 1 is a cross-sectional view taken along line A–A' of FIG. 3, and shows the structure of the TFT 2 in cross section. As shown in FIG. 1, on a transparent insulating substrate 5 is provided a gate signal line 3 as a scanning line, which also serves as gate electrode of the TFT 2, and a gate insulating film 11 is provided so as to cover the gate signal line 3 and the remainder of the transparent insulating substrate 5. On the upper surface of the gate insulating film 11 above the gate signal line 3 is provided a semiconductor layer 6, the upper surface of which is in turn provided with a source electrode 7 and a drain electrode 8, made of n$^+$-Si layers. On the upper surfaces of the source electrode 7 and the drain electrode 8 are provided a source signal line 4 as a grayscale signal line and a drain extraction electrode 9, respectively, the upper surfaces of which are in turn provided with an interlayer insulating film 10. The upper surface of the interlayer insulating film 10 is provided with the pixel electrode 1.

In the present embodiment, as shown in FIG. 1, the gate signal line 3 has a three-layer structure made up of a gate signal line lower layer 3a, a gate signal line intermediate layer 3b, and a gate signal line upper layer 3c. In the same way, the source signal line 4 and the drain extraction electrode 9 also have a three-layer structure of a source signal line lower layer 4a, a source signal line intermediate layer 4b, and a source signal line upper layer 4c, and an extraction electrode lower layer 9a, an extraction electrode intermediate layer 9b, and an extraction electrode upper layer 9c, respectively. Further, the gate signal line lower layer 3a, the source signal line lower layer 4a, and the extraction electrode lower layer 9a are made of titanium, the gate signal line intermediate layer 3b, the source signal line intermediate layer 4b, and the extraction electrode intermediate layer 9b are made of aluminum, and the gate signal line upper layer 3c, the source signal line upper layer 4c, and the extraction electrode upper layer 9c are made of titanium containing nitrogen.

An active matrix substrate with the foregoing structure is prepared as follows. First, sputtering is used to form on the transparent insulating substrate 5 a titanium film 30 nm thick as the gate signal line lower layer 3a, an aluminum film 100 nm thick as the gate signal line intermediate layer 3b, and a titanium film containing nitrogen 50 nm thick as the gate signal line upper layer 3c. Then, by photolithography-dry etching, the gate signal line lower layer 3a, intermediate layer 3b, and upper layer 3c are patterned in a shape appropriate for the gate electrode and gate signal line 3.

Next, on the transparent insulating substrate 5 provided with the gate signal line 3, plasma CVD is used to successively form a silicon nitride film 400 nm thick as the gate insulating film 11, an amorphous silicon layer 130 nm thick as the semiconductor layer 6, and n$^+$-Si layers 40 nm thick as the source electrode 7 and the drain electrode 8, in that order. Then the semiconductor layer 6, the source electrode 7, and the drain electrode 8 are patterned by photolithography-dry etching.

Next, on the source electrode 7, drain electrode 8, and gate insulating film 11, sputtering by the plasma CVD method is used to form titanium films 30 nm thick as the source signal line lower layer 4a and the extraction electrode lower layer 9a, aluminum films 100 nm thick as the source signal line intermediate layer 4b and the extraction electrode intermediate layer 9b, and titanium films containing nitrogen 50 nm thick as the source signal line upper layer 4c and the extraction electrode upper layer 9c, in that order. Then the source signal line 4 and drain extraction electrode 9 are patterned by photolithography-dry etching.

Thereafter, plasma CVD is used to form a silicon nitride film 300 nm thick as the interlayer insulting film 10. A contact hole is formed in the interlayer insulating film 10 to electrically connect the drain extraction electrode 9 and the pixel electrode 1, and sputtering is used to form a transparent conductive film of ITO (indium tin oxide) 100 nm thick as the pixel electrode 1, which is then patterned.

As discussed above, the present embodiment is structured so that beneath the gate insulating film 11 made of a silicon nitride film lies the gate signal line upper layer 3c made of a titanium film containing nitrogen, beneath which lies the gate signal line intermediate layer 3b made of an aluminum film. Consequently, natural oxidation of the upper surface of the gate signal line 3 can be prevented, and adhesion with the gate insulating film 11 made of a silicon nitride film can be improved. Accordingly, deterioration over time can be minimized, and yield can be improved by suppressing film peeling during the manufacturing process, thus making it possible to provide an inexpensive liquid crystal display device with superior display quality.

Next, actual film formation of titanium films containing nitrogen as the gate signal line upper layer 3c was performed by reactive sputtering, while changing the nitrogen partial pressure ratio as a parameter. The following will explain, with reference to Table 1 below, change in resistivity and adhesion to a silicon nitride film accompanying change in this parameter. Here, film formation was performed under sputtering conditions of a substrate temperature of 150° C., gas pressure of 0.8 Pa, and applied power of 30 kW.

TABLE 1

| NITROGEN PARTIAL PRESSURE RATIO | RESISTIVITY ($\mu\Omega$cm) | ADHESION TO SILICON NITRIDE FILM |
| --- | --- | --- |
| 0% | 56 | POOR |
| 20% | 80 | POOR |
| 40% | 135 | FAIR |
| 60% | 499 | GOOD |
| 80% | 417 | GOOD |

As shown in Table 1, resistivity of TiN increases with increase of the nitrogen partial pressure ratio, becoming saturated when the nitrogen partial pressure ratio is 60% or higher. Further, adhesion to the silicon nitride film is fair when the nitrogen partial pressure ratio is 40%, and good at 60% and above. As the foregoing results show, in view of the fact that the rate of film formation is impaired if the nitrogen partial pressure ratio is increased too much, a titanium film containing nitrogen having good adhesion with a silicon nitride film can be formed with good production efficiency if film formation is performed under a nitrogen partial pressure ratio of 60% to 80%.

Figure 4:
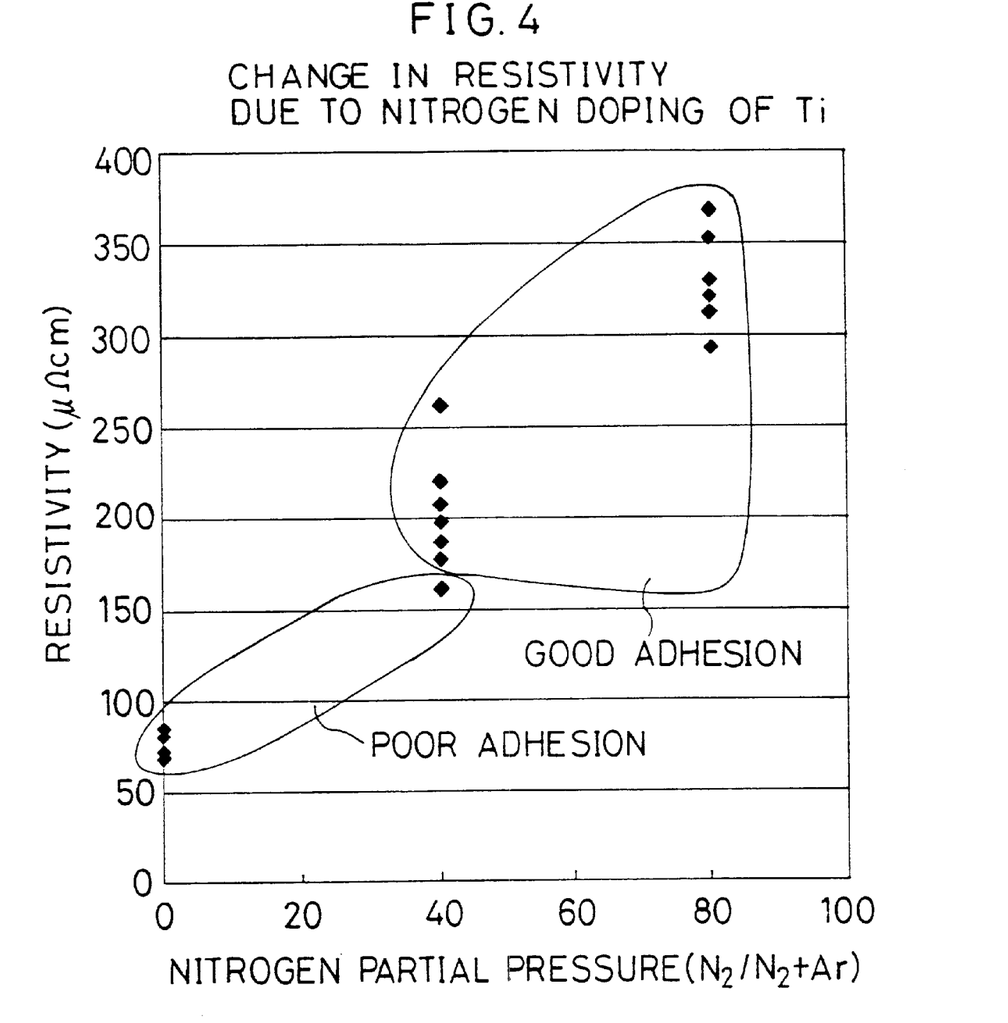
FIG. 4 is a graph showing a relationship between partial pressure of nitrogen and resistivity when titanium is doped with nitrogen.

FIG. 4 is a graph showing a relationship between partial pressure of nitrogen and resistivity when Ti is doped with nitrogen. As shown in FIG. 4, adhesion to the silicon nitride film is improved when resistivity is 170 $\mu\Omega$cm or higher, and good adhesion to silicon nitride can be stably obtained when resistivity is 200 $\mu\Omega$cm or higher.

The following will explain the gate signal line intermediate layer 3b and the gate signal line lower layer 3a. When a titanium layer as the gate signal line lower layer 3a is provided with an aluminum layer as the gate signal line intermediate layer 3b, the Al formed on the Ti has <100> alignment, and a line with low resistance can be obtained. Further, since the film formation rate of Ti is faster than that of TiN, a line like the present gate signal line 3 having a TiN/Al/Ti structure can be formed in a shorter time than a line having a TiN/Al/TiN structure.

Further, by adopting, as in the present embodiment, a three-layer structure like that of the gate signal line 3 for the source signal line 4 and the drain extraction electrode 9 as well, they can be given good adhesion to the interlayer insulating film 11 made of a silicon nitride film.

As discussed above, in the thin-film transistor according to the present embodiment, the gate signal line and/or source signal line, located below the gate insulating film and/or interlayer insulating film made of a silicon nitride film, has a laminar structure made up of an upper layer made of a titanium film containing nitrogen, and another layer, made of an aluminum film, provided below the upper layer. Consequently, adhesion with the silicon nitride film is improved in comparison with a case in which the upper layer is made of a titanium film, and film peeling during subsequent manufacturing steps can be prevented. Accordingly, a thin-film transistor with more stable properties can be provided with good yield. Further, by applying such a thin-film transistor in a liquid crystal display device, it is possible to provide an inexpensive liquid crystal display device having superior display quality.

In addition, by further providing a titanium film below the aluminum film, a gate signal line and/or source signal line with low resistance can be obtained. Further, since the film formation rate of a titanium film is faster than that of a titanium film containing nitrogen, a line like the foregoing having a TiN/Al/Ti structure can be formed in a shorter time than a line having a TiN/Al/TiN structure.

Incidentally, in the foregoing structure, the gate signal line intermediate layer 3b, source signal line intermediate layer 4b, and extraction electrode intermediate layer 9b are made of aluminum films, but in order to further improve reliability, it is also possible to form these layers of an aluminum alloy film chiefly comprised of aluminum.

Further, in the foregoing structure, the gate signal line lower layer 3a, source signal line lower layer 4a, and extraction electrode lower layer 9a are made of titanium films, but in order to regularize the film formation conditions for all of the titanium films, it is also possible to form these layers of titanium films containing nitrogen, like the gate signal line upper layer 3c, the source signal line upper layer 4c, and the extraction electrode upper layer 9c.

Further, in the foregoing structure, the gate signal line 3, source signal line 4, and drain extraction electrode 9 are given a three-layer laminar structure to give them good adhesion to the gate insulating film 11 or the interlayer insulating film 10, but it is also possible to form either the gate signal line 3 or the source signal line 4 and drain extraction electrode 9 of a single layer of another metal such as tantalum or chrome.

As discussed above, a thin-film transistor according to the present embodiment may be structured so as to comprise a gate signal line, a gate insulating film provided on the gate signal line, a semiconductor layer provided on the gate insulating film, a source signal line, and a drain extraction electrode; in which the gate signal line is an aluminum film or an aluminum alloy film chiefly comprised of aluminum; the gate insulating film is made of a silicon nitride film; and a titanium film containing nitrogen, having a resistivity of no less than 200 $\mu\Omega$cm, is provided between and in contact with the gate signal line and the gate insulating film.

Further, a thin-film transistor according to the present embodiment may be structured so as to comprise a gate signal line, a gate insulating film provided on the gate signal line, a semiconductor layer provided on the gate insulating film, a source signal line, a drain extraction electrode, and an interlayer insulating film provided on the source signal line; in which the source signal line is an aluminum film or an aluminum alloy film chiefly comprised of aluminum; the interlayer insulating film is made of a silicon nitride film; and a titanium film containing nitrogen, having a resistivity of no less than 200 $\mu\Omega$cm, is provided between and in contact with the source signal line and the interlayer insulating film.

In addition, a titanium film may be further provided beneath the foregoing aluminum film or aluminum alloy film.

A liquid crystal display device according to the present invention may be structured so as to include a thin-film transistor comprising a gate signal line, a gate insulating film provided on the gate signal line, a semiconductor layer provided on the gate insulating film, a source signal line, and a drain extraction electrode; in which the gate signal line is an aluminum film or an aluminum alloy film chiefly comprised of aluminum; the gate insulating film is made of silicon nitride; and a titanium film containing nitrogen, having a resistivity of no less than 200 $\mu\Omega$cm, is provided between and in contact with the gate signal line and the gate insulating film.

Further, a liquid crystal display device according to the present embodiment may be structured so as to include a thin-film transistor comprising a gate signal line, a gate insulating film provided on the gate signal line, a semiconductor layer provided on the gate insulating film, a source signal line, a drain extraction electrode, and an interlayer insulating film provided on the source signal line; in which the source signal line is an aluminum film or an aluminum alloy film chiefly comprised of aluminum; the interlayer insulating film is made of silicon nitride; and a titanium film containing nitrogen, having a resistivity of no less than 200 $\mu\Omega$cm, is provided between and in contact with the source signal line and the interlayer insulating film.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations, provided such variations do not depart from the spirit of the present invention or exceed the scope of the patent claims set forth below.

What is claimed is:

1. A thin-film transistor comprising:

a gate signal line;

a gate insulating film made of a silicon nitride film, provided on said gate signal line;

a semiconductor layer provided on said gate insulating film; and a source signal line and/or a drain extraction electrode;

wherein said gate signal line includes a first layer made of a titanium film containing nitrogen, provided in contact with said gate insulating film, a second layer made of a film containing aluminum, provided beneath said first layer, and a third layer made of a film containing titanium, provided beneath said second layer.

2. The thin-film transistor set forth in claim 1, wherein:

said titanium film containing nitrogen, which comprises said first layer, has a resistivity of no less than 200 $\mu\Omega$cm.

3. The thin-film transistor set forth in claim 1, wherein:

said second layer is made of an aluminum alloy film chiefly comprised of aluminum.

4. The thin-film transistor set forth in claim 1, wherein:

said titanium film containing nitrogen, which comprises said first layer, has a resistivity of no less than 170 $\mu\Omega$cm.

5. A liquid crystal display device comprising an active matrix substrate provided with a plurality of thin-film transistors, a counter substrate provided opposite said active matrix substrate with an interval therebetween, and a liquid crystal layer in the interval between said active matrix substrate and said counter substrate, wherein each said thin-film transistor comprises:

a gate signal line;

a gate insulating film made of a silicon nitride film, provided on said gate signal line;

a semiconductor layer provided on said gate insulating film; and a source signal line and/or a drain extraction electrode;

said gate signal line including a first layer made of a titanium film containing nitrogen, provided in contact with said gate insulating film, a second layer made of a film containing aluminum, provided beneath said first layer, and a third layer made of a film containing titanium, provided beneath said second layer.

6. The thin-film transistor set forth in claim 5, wherein:

said titanium film containing nitrogen, which comprises said first layer, has a resistivity of no less than 200 $\mu\Omega$cm.

7. The thin-film transistor set forth in claim 5, wherein:

said second layer is made of an aluminum alloy film chiefly comprised of aluminum.

8. The liquid crystal display device set forth in claim 5, wherein:

said titanium film containing nitrogen, which comprises said first layer, has a resistivity of no less than 170 $\mu\Omega$cm.

* * * * *

UNITED STATES PATENT AND TRADEMARK OFFICE
CERTIFICATE OF CORRECTION

PATENT NO. : 6,744,070 B2
DATED : June 1, 2004
INVENTOR(S) : Yoshinori Shimada et al.

It is certified that error appears in the above-identified patent and that said Letters Patent is hereby corrected as shown below:

Title page,
Item [56], U.S. PATENT DOCUMENTS, change "6,087,678 A" to -- 6,078,678 A --

Signed and Sealed this

Fifth Day of October, 2004

JON W. DUDAS
*Director of the United States Patent and Trademark Office*